(12) United States Patent
Thorne

(10) Patent No.: US 7,493,461 B1
(45) Date of Patent: Feb. 17, 2009

(54) DYNAMIC PHASE ALIGNMENT FOR RESYNCHRONIZATION OF CAPTURED DATA

(75) Inventor: Neil Thorne, London (GB)

(73) Assignee: Altera Corporation, San Jose, CA (US)

( * ) Notice: Subject to any disclaimer, the term of this patent is extended or adjusted under 35 U.S.C. 154(b) by 261 days.

(21) Appl. No.: 11/040,324

(22) Filed: Jan. 20, 2005

(51) Int. Cl.
G06F 13/00 (2006.01)
G06F 12/00 (2006.01)
G06F 1/12 (2006.01)
H03K 19/00 (2006.01)

(52) U.S. Cl. .................. 711/167; 711/104; 711/154; 326/93; 713/400

(58) Field of Classification Search .................. 711/167, 711/154, 104; 326/93; 713/400
See application file for complete search history.

(56) References Cited

U.S. PATENT DOCUMENTS

| | | | | |
|---|---|---|---|---|
| 5,953,284 A * | 9/1999 | Baker et al. | .................. | 365/233 |
| 6,041,417 A * | 3/2000 | Hammond et al. | .......... | 713/400 |
| 6,147,963 A * | 11/2000 | Walker et al. | ................ | 370/200 |
| 6,338,127 B1 * | 1/2002 | Manning | .................... | 711/167 |
| 6,647,523 B2 * | 11/2003 | Manning | .................... | 714/720 |
| 6,681,237 B1 * | 1/2004 | Fossum et al. | .............. | 708/606 |
| 6,889,334 B1 | 5/2005 | Magro et al. | | |
| 7,275,174 B2 * | 9/2007 | Cheung et al. | .............. | 713/500 |
| 2001/0046163 A1 | 11/2001 | Yanagawa | | |
| 2002/0099987 A1 | 7/2002 | Corbin et al. | | |

* cited by examiner

*Primary Examiner*—Hyung S Sough
*Assistant Examiner*—Mardochee Chery
(74) *Attorney, Agent, or Firm*—Townsend and Townsend and Crew LLP

(57) ABSTRACT

A source synchronous external memory device returns data to a memory controller of an electronic device with its own clock signal, which allows the returned data to be captured with a high degree of accuracy. The captured data must then be resynchronized with the clock signal which controls the other components of the electronic device. This problem is particularly acute in the case of high speed memory devices, such as DDR (Double Data Rate) memory devices, and similar memory devices. Test data is written to the external memory device, and is then read back several times. Attempts are made to resynchronize the captured data with the system clock, with different relative variations in the phase of the captured data and the system clock, in order to select a value for the relative phase, which allows for optimum resynchronization.

28 Claims, 6 Drawing Sheets

DYNAMIC PHASE ALIGNMENT FOR RESYNCHRONIZATION OF CAPTURED DATA

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK.

Not Applicable

BACKGROUND OF THE INVENTION

1. Technical Field of the Invention

This invention relates to a memory controller, and to a method for use in a memory controller, in order to synchronize captured data with a system clock signal.

2. Background of the Invention

In many electronic devices, it is common for a separate memory device to be provided. Data must then be written to, and read from, this separate memory device, by way of a memory interface.

A source synchronous external memory device returns data with its own clock signal, which allows the returned data to be captured with a high degree of accuracy. However, there then remains the problem of resynchronizing the captured data with the clock signal which controls the other components of the electronic device. This can be difficult because, although the clock signal accompanying the returned data is derived originally from the system clock, it is offset by a variable delay.

For example, this time delay depends upon the length of the data paths to and from the memory device. In addition, even in devices which have been manufactured to the same specification, the time delay can vary from one device to another, because of manufacturing process variations. Further, the time delay can vary in use of a single device, because of changes in the supply voltage and/or the operating temperature of the device.

The problem of resynchronization of the captured data with the system clock is particularly acute in the case of high speed memory devices, such as DDR (Double Data Rate) memory devices, and similar memory devices.

One solution to this problem is disclosed in the document 'DDR SDRAM Controller MegaCore Function User Guide, version 1.2.0', published by Altera Corporation, at pages 78-86, which describes a timing analysis to resynchronize the captured data with the system clock.

However, it is time consuming to perform this analysis. Further, changes in the time delay resulting from changes in the operating voltage and temperature cannot be compensated in this way.

BRIEF SUMMARY OF THE INVENTION

In accordance with the present invention, test data is written to the external memory device, and is then read back several times. Attempts are made to resynchronize the captured data with the system clock, with relative variations in the phase of the captured data and the system clock, in order to select a value for the relative phase, which allows for optimum resynchronization.

In accordance with another aspect of the present invention, there is provided a memory controller, which is adapted to determine the optimum relative phase of the captured data and the system clock, in order to achieve resynchronization.

DETAILED DESCRIPTION OF THE INVENTION

Figure 1:
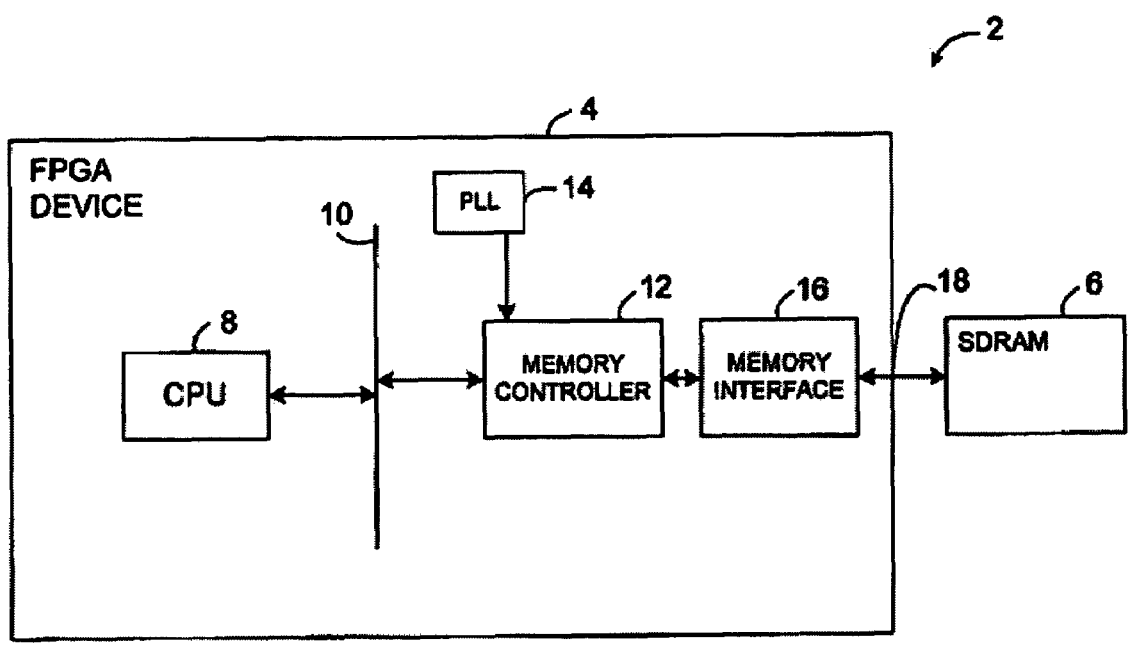
FIG. 1 is a block schematic diagram of a system incorporating a memory controller in accordance with the present invention.

FIG. 1 is a block schematic diagram of a part of an electronic device, incorporating a memory controller in accordance with the present invention.

In this illustrated embodiment of the invention, the electronic device 2 incorporates a field programmable gate array (FPGA) 4 and an external memory device 6.

As is well known, a FPGA contains an array of logic elements, which can be configured to perform a desired set of functions. In this illustrated example, the FPGA is configured to include a processor (CPU) 8, connected over a bus 10 to a memory controller 12. The FPGA 4 also includes a phase locked loop (PLL) 14, which can provide clock signals. The memory controller 12 is connected via a memory interface 16 to external pins 18 of the FPGA device 4, and can thus be connected to the external memory device 6.

It will however be appreciated that, although the memory controller 12 described herein is implemented in a FPGA, it can be implemented in other ways, either as a separate integrated circuit, or as part of any larger device. Further, although the memory controller 12 is connected in this example to a CPU 8 over a bus 10, the memory controller according to the present invention can, if required, be connected directly to another device such as a processor.

In this illustrated example, the external memory device 6 is a Double Data Rate Synchronous Dynamic Random Access Memory (DDR-SDRAM), although the memory controller of the present invention can be designed to operate with any source synchronous external memory device. In particular, the memory controller of the present invention has advantages when used in connection with any high speed memory device, including DDR-SDRAM, DDR2-SDRAM, Fast Cycle RAM (FCRAM-I/II), or Reduced Latency DRAM (RLDRAM-II).

Figure 2:
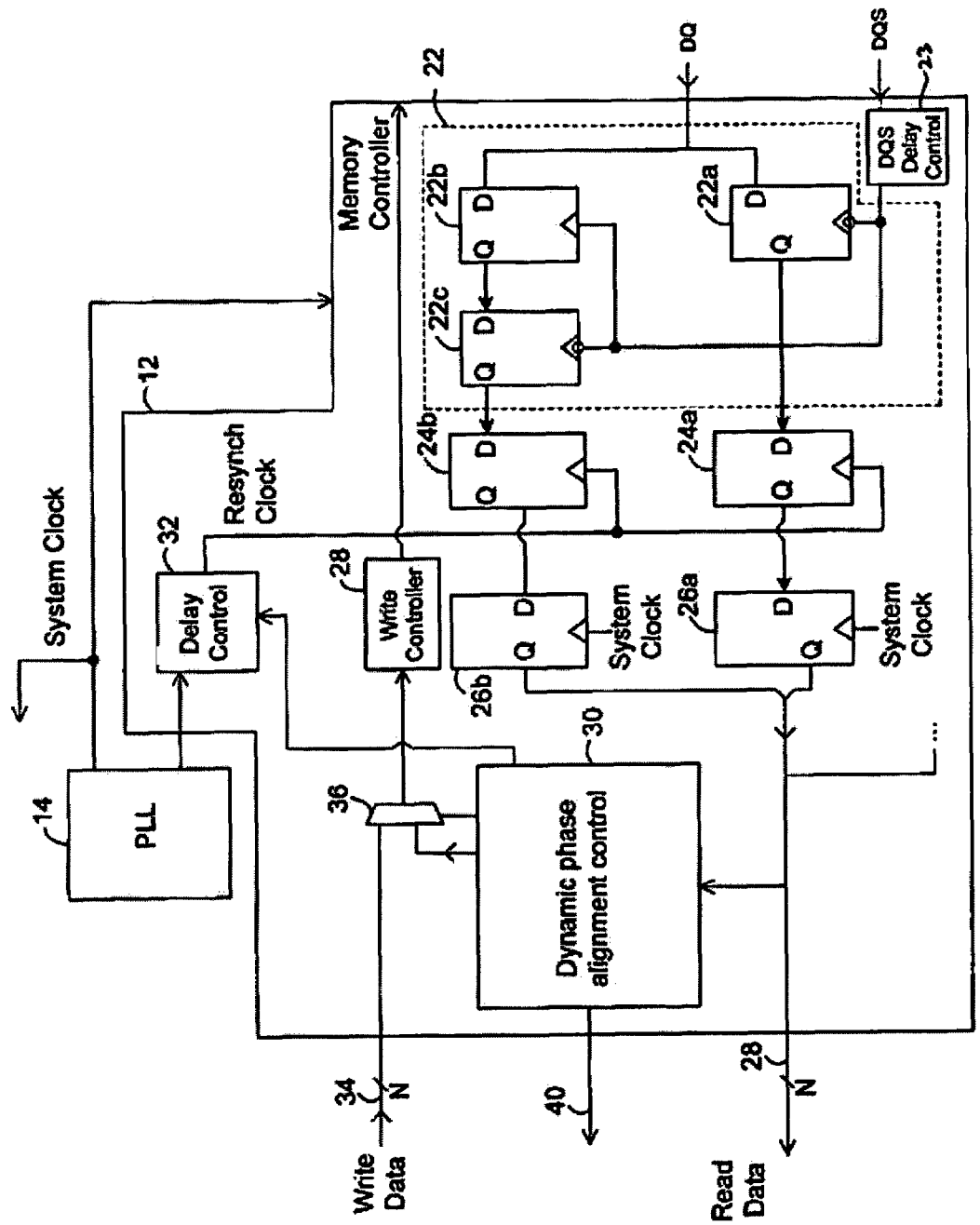
FIG. 2 is a block schematic diagram showing a first embodiment of a memory controller in accordance with the invention.

FIG. 2 is a block schematic diagram of a memory controller, in accordance with a first embodiment of the present invention.

As is generally conventional, the memory controller 12 includes a capture register block 22. More specifically, the memory controller 12 is connected to the external memory device 6 by way of a connector which may, for example, be 64 bits wide. In that case, where the external memory device is a DDR device, or a similar device as described above, there is a capture register block 22 for each pair of data bits, although FIG. 2 shows only one capture register block in detail for ease of illustration. Again, as is conventional, the capture register block 22 includes a first capture register 22a, a second capture register 22b, and a third capture register 22c.

The received data signal DQ is passed to the first and second capture registers 22a, 22b, and the output of the second capture register 22b is passed to a third capture register 22c. The second capture register 22b is clocked by a strobe signal DQS, while the first capture register 22a and the third capture register 22c are clocked by the inverse of the strobe signal DQS. As is known, the phase of the strobe signal DQS can be varied in a DQS control block 23 according to a known technique, in order to allow the data to be captured most accurately. This structure allows the memory controller to capture data at the double data rate.

The output of the first capture register 22a is passed to a first resynchronization register 24a, whose output in turn passes to a further register 26a. The output of the third capture register 22c is passed to a second resynchronization register 24b, whose output in turn passes to a further register 26b.

The outputs of the further registers 26a, 26b are supplied on an output line 28 as Read Data, and is also applied to a dynamic phase alignment control block 30.

As mentioned above, there is a capture register block 22 for each pair of data bits received from the external memory device, and there is also a corresponding pair of resynchronization registers and further registers. The outputs from these further registers are combined with the outputs of the further registers 26a, 26b as an N-bit wide Read Data output.

The resynchronization registers 24a, 24b are clocked by a resynchronization clock signal, which is output from a delay control block 32. The delay control block 32 generates the resynchronization clock signal on the basis of a clock signal supplied from the PLL 14, modified under the control of the dynamic phase alignment control block 30. The further registers 26a, 26b are clocked by the system clock, as generated by the PLL 14, the system clock also being applied to the other components of the device 4.

Write Data is supplied to the memory controller 12 on an input line 34, which is connected to a multiplexer 36. The multiplexer 36 also receives data from the dynamic phase alignment control block 30, and is controlled by a control signal from the dynamic phase alignment control block 30. The output of the multiplexer 36 is connected to a write controller 38, which operates in a conventional way to supply data to be written to the external memory device 6.

The dynamic phase alignment control block 30 is also connected to an output line 40, on which it can supply control signals.

Figure 3:
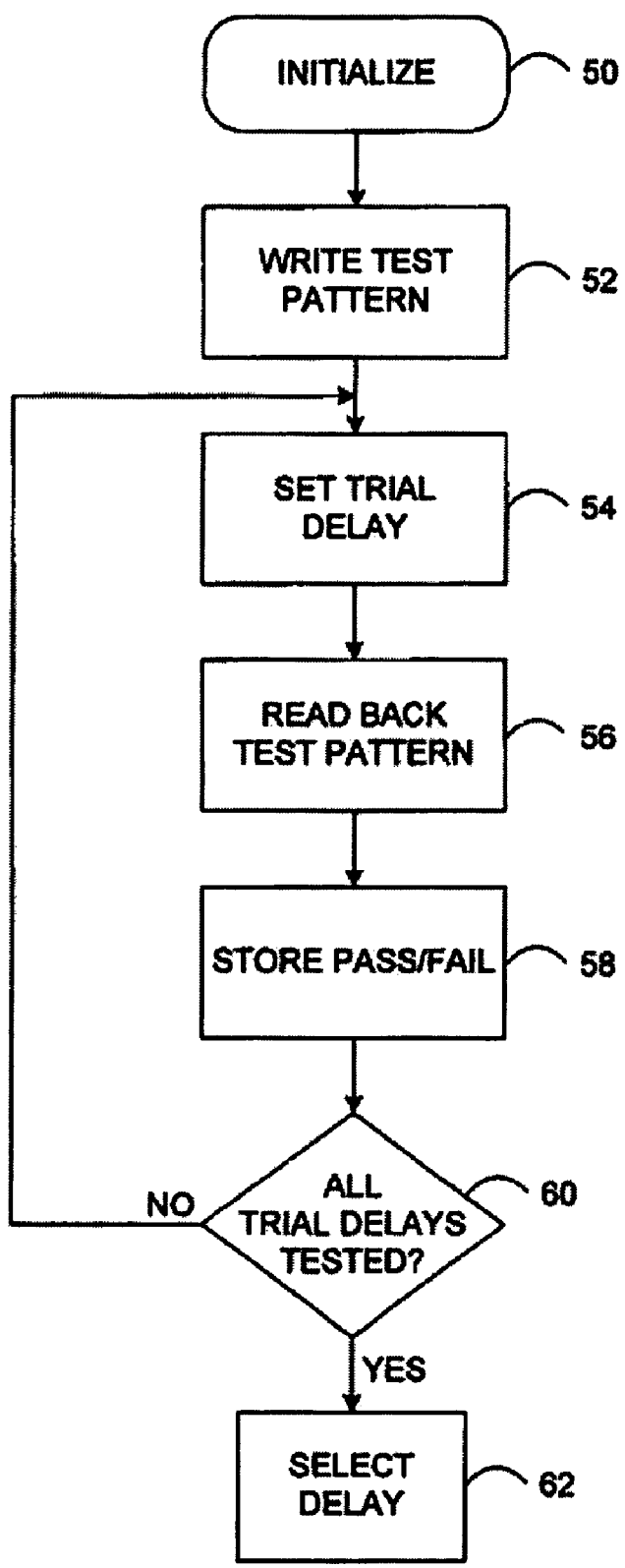
FIG. 3 is a flow chart illustrating the method of operation of the memory controller of FIG. 2.

FIG. 3 is a flow chart illustrating a method of operation of the memory controller 12 shown in FIG. 2.

In step 50, the device 4 is initialized and, in accordance with the invention, steps are taken to resynchronize the data captured by the capture register block 22 with the system clock, as it is used to clock the further registers 26a, 26b.

Although, in this illustrated embodiment, the method is described as taking place on initialisation of the device 4, the steps may be taken at intervals during the operation of the device, in order to ensure that the resynchronization is adapted to take account of any subsequent changes in the operating voltage and/or temperature of the device.

During the adaption process, it is not possible to write data to, or read data from the external memory device 6, and a control signal is sent on the output line 40 to prevent access requests being made.

In step 52, a test data pattern is written to the external memory device 6, that is, a test data sequence is output from the dynamic phase alignment control block 30 to the multiplexer 36, which is then controlled such that this test data sequence is sent to the write controller 38, and written to the external memory device 6.

As will be understood by the person skilled in the art, the test data pattern can be chosen in order to maximize the probability that changes in the phase of the resynchronization clock will lead to changes in the data pattern read back. For example, the test data pattern may contain a sequence in which the data value toggles between the two binary values and/or in which a relatively long sequence of one binary value is followed by the other binary value.

As mentioned previously, the capture register block 22 operates on the basis of a DQS signal, which is sent from the external memory device 6, and is derived from the system clock frequency, but is delayed by an unknown time delay. Although the time delay is not known, it is possible to set upper and lower limits, defining a range within which the time delay must lie. The method according to the present invention is then concerned with determining the phase which allows the captured data to be resynchronized with the system clock most accurately.

The clock phase is applied in the resynchronization registers 24a, 24b which, as described above, are clocked by a resynchronization clock signal, output from the delay control block 32. In accordance with the invention, the delay control block 32 is used to set various values for this time delay, and these time delays are tested in turn, in order to determine the value which allows the test sequence of data to be read back with the lowest probability of an error.

Thus, in step 54, a trial value is set for the delay. The delay is set in the delay control block 32, under the control of the dynamic phase alignment control block 30.

Figure 4:
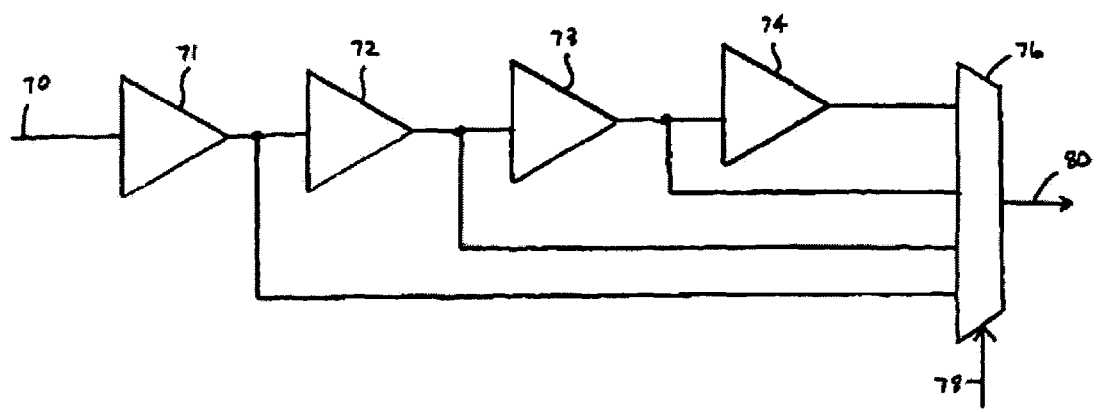
FIG. 4 is a block schematic diagram of a part of the memory controller of FIG. 2.

FIG. 4 is a block schematic diagram, showing one possible form of the delay control block 32. Specifically, the delay control block 32 shown in FIG. 4 receives the clock signal from the PLL 14 on an input line 70, and contains a series of delay elements 71-74. In this illustrative example, there are four such delay elements, although in practice it will usually be more appropriate to provide more than this. The outputs from the first three delay elements 71-73 are passed to the next delay element, and are also passed to a multiplexer 76. The output from the fourth delay element 74 is also passed to the multiplexer 76.

The multiplexer 76 is controlled, by a control signal on a line 78, received from the dynamic phase alignment control block 30, to output one of these delayed signals on an output line 80 to the resynchronization registers 24a, 24b. Thus, in step 54, a control signal is sent from the dynamic phase alignment control block 30 to the multiplexer 76, in order to apply a particular delay to the resynchronization clock signal applied to the resynchronization registers 24a, 24b.

Then, in step 56, the test sequence of data is read back from the external memory device 6, and is supplied from the further registers 26a, 26b to the dynamic phase alignment control block 30. The control block 30 can then compare the data read back with the data which was written to the external memory device, and to determine whether it contains any errors. Then, in step 58, the control block 30 determines whether this trial value of the delay led to a 'pass', in which the data read back contains no errors, or to a 'fail', in which the data read back contains one or more errors.

In step 60, the control block 30 determines whether all of the required trial values of the delay have been tested in this way. If so, the process passes to step 62 but, if there remain any trial values of the delay to be tested, the process returns to steps 54, and the further trial value of the delay is tested.

When the process eventually reaches step 62, the control block 30 determines which of the trial values should be used for the further operation of the device.

Provided that the trial values have been selected appropriately, it is likely that some of the trial values in a central part of the range will have led to a 'pass' condition, while other trial values, towards the two ends of the range, will have lead to a 'fail' condition.

In a preferred embodiment of the invention, the trial value of the delay which is then selected in step 62 is the trial value which is in the middle of the group of values leading to 'pass' conditions. Where there are an even number of trial values leading to 'pass' conditions, one of the two values in the middle of this group is selected.

When the delay value has been selected, and the adaption is complete, a control signal may be output on the line 40, to indicate that data may now be written or read. At this point, normal operation of the device can continue, with the resynchronization registers 24a, 24b being clocked by the selected optimum resynchronization clock signal.

FIGS. 2 and 3 show an arrangement in which the resynchronization clock signal is obtained by applying different time delays to the clock signal received from the PLL 14. However, it will be apparent that the same effect can be achieved by applying different phase shifts to the clock signal received from the PLL 14. Further, in some cases, the PLL 14 will be adapted to produce multiple clock signals at the same frequency, but with different phases. In that case, the delay control block 32 may simply supply these different clock signals to the resynchronization registers 24a, 24b at different times to allow a clock signal with the optimum phase to be selected as described above. Further, the delay control block 32 may apply each of these different clock signals with different additional delays (or different additional phase shifts) at different times to allow a clock signal with the optimum phase to be selected as described above.

Figure 5:
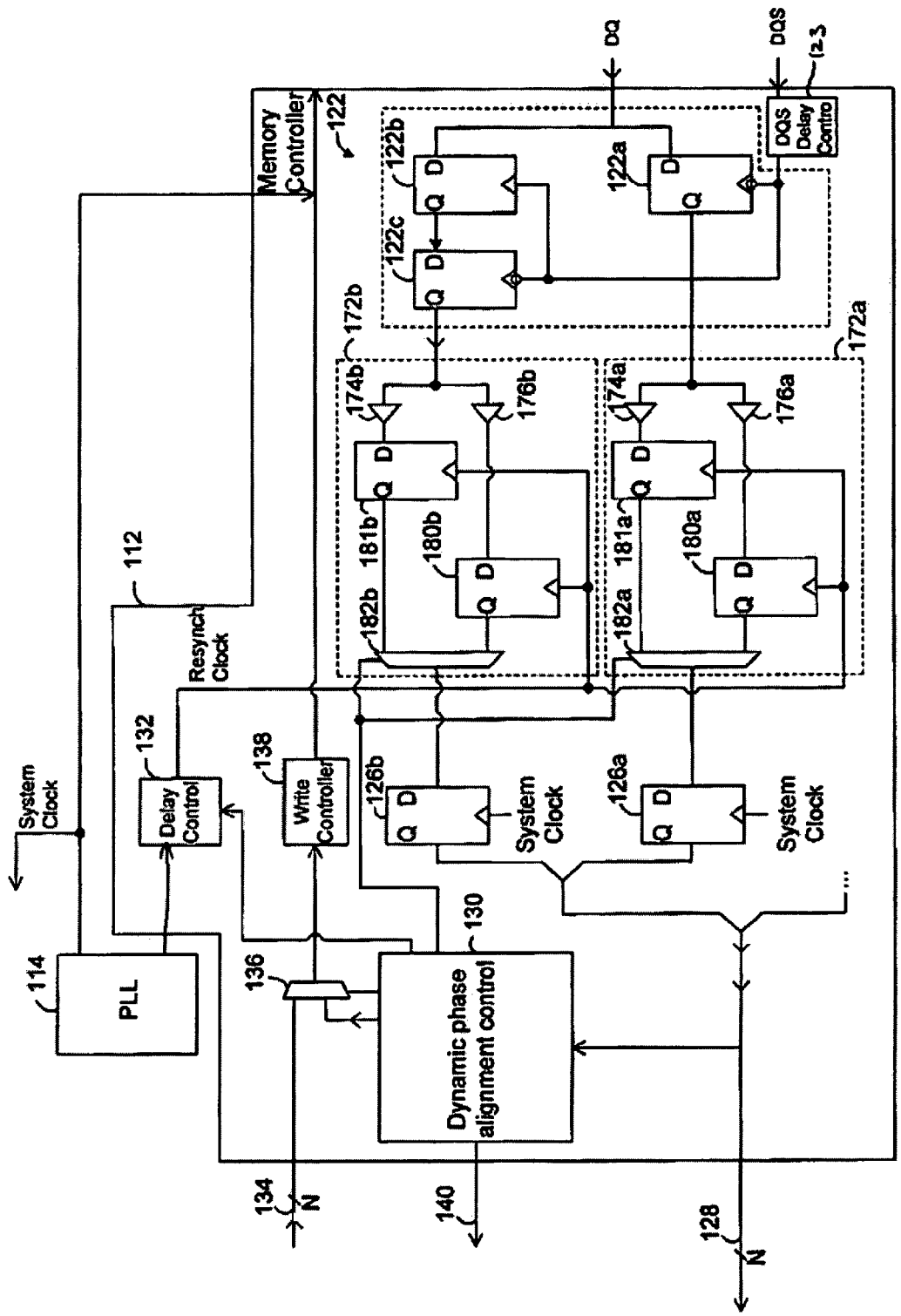
FIG. 5 is a block schematic diagram of a memory controller in accordance with a second embodiment of the invention.

FIGS. 2 and 3 show an arrangement in which the optimum relative phase, between the captured data and the resynchronization clock, is determined by changing the phase of the clock. FIG. 5 and y show an arrangement in which this is determined by changing the phase of the captured, data.

Thus, FIG. 5 is a block schematic diagram of a memory controller 112, in accordance with a second embodiment of the present invention. As is generally conventional, the memory controller 112 includes capture register blocks 122. More specifically, the memory controller 112 is connected to the external memory device 6 by way of a connector which may, for example, be 64 bits wide. In that case, where the external memory device is a DDR device, or a similar device as described above, there is a capture register block 122 for each pair of data bits, although FIG. 5 shows only one capture register block in detail for ease of illustration. Again, as is conventional, the capture register block 122 includes a first capture register 122a, a second capture register 122b, and a third capture register 122c.

Again, as is conventional, the received data signal DQ is passed to the first and second capture registers 122a, 122b, and the output of the second capture register 122b is passed to a third capture register 122c. The second capture register 122b is clocked by a strobe signal DQS, while the first capture register 122a and the third capture register 122c are clocked by the inverse of the strobe signal DQS. As is known, the phase of the strobe signal DQS can be varied in a DQS control block 123 according to a known technique, in order to allow the data to be captured most accurately. This structure allows the memory controller to capture data at the double data rate.

The output of the first capture register 122a is passed to a first adaptive resynchronization register block 172a, whose output in turn passes to a further register 126a. The output of the third capture register 122c is passed to a second adaptive resynchronization register block 172b, whose output in turn passes to a further register 126b.

The outputs of the further registers 126a, 126b are supplied on an output line 128 as Read Data, and is also applied to a dynamic phase alignment control block 130.

As mentioned above, there is a capture register block 122 for each pair of data bits received from the external memory device, and there is also a corresponding pair of adaptive resynchronization register blocks and further registers. The outputs from these further registers are combined with the outputs of the further registers 126a, 126b as an N-bit wide Read Data output.

The first adaptive resynchronization register block 172a receives the data output frond the first capture register 122a. This data is passed through respective delay elements 174a, 176a, having different delay values to respective resynchronization registers 181a, 180a. Thus, the delay elements 174a, 176a apply different delays to their respective input signals. FIG. 4 shows only two delay elements 174a, 176a and two resynchronization registers 181a, 180a for ease of illustration, although in practice there will be more than this.

The outputs from the resynchronization registers 181a, 180a are passed to a multiplexer 182a, which operates under the control of the dynamic phase alignment control block 130, as will be described in more detail below. The output from the multiplexer 182a passes to the further register 126a.

The resynchronization registers 181a, 180a are clocked by a resynchronization clock, which is output from the PLL 114. The further register 126a is clocked by the system clock, also as generated by the PLL 114, the system clock also being applied to the other components of the device 4.

Similarly, the second adaptive resynchronization register block 172b receives the data output from the third capture register 122c. This data is passed through respective delay elements 174b, 176b, having different delay values to respective resynchronization registers 181b, 180b. Thus, the delay elements 174b, 176b apply different delays to their respective input signals. FIG. 4 shows only two delay elements 174b, 176b and two resynchronization registers 181b, 180b for ease of illustration, although in practice there will be more than this. The delay element 174b applies the same delay as the delay element 174a in the block 172a, and the delay element 176b applies the same delay as the delay element 176a in the block 172a.

The outputs from the resynchronization registers 181b, 180b are passed to a multiplexer 182b, which operates under the control of the dynamic phase alignment control block 130, as will be described in more detail below. The output from the multiplexer 182b passes to the further register 126b.

The resynchronization registers 181 b, 180b are clocked by a resynchronization clock, which is output from the PLL 114. The further register 126b is clocked by the system clock, also as generated by the PLL 114

Write Data is supplied to the memory controller 112 on an input line 134, which is connected to a multiplexer 136. The multiplexer 136 also receives data from the dynamic phase alignment control block 130, and is controlled by a control signal from the dynamic phase alignment control block 130. The output of the multiplexer 136 is connected to a write controller 138, which operates in a conventional way to supply data to be written to the external memory device 6.

The dynamic phase alignment control block 130 is also connected to an output line 140, on which it can supply control signals.

Figure 6:
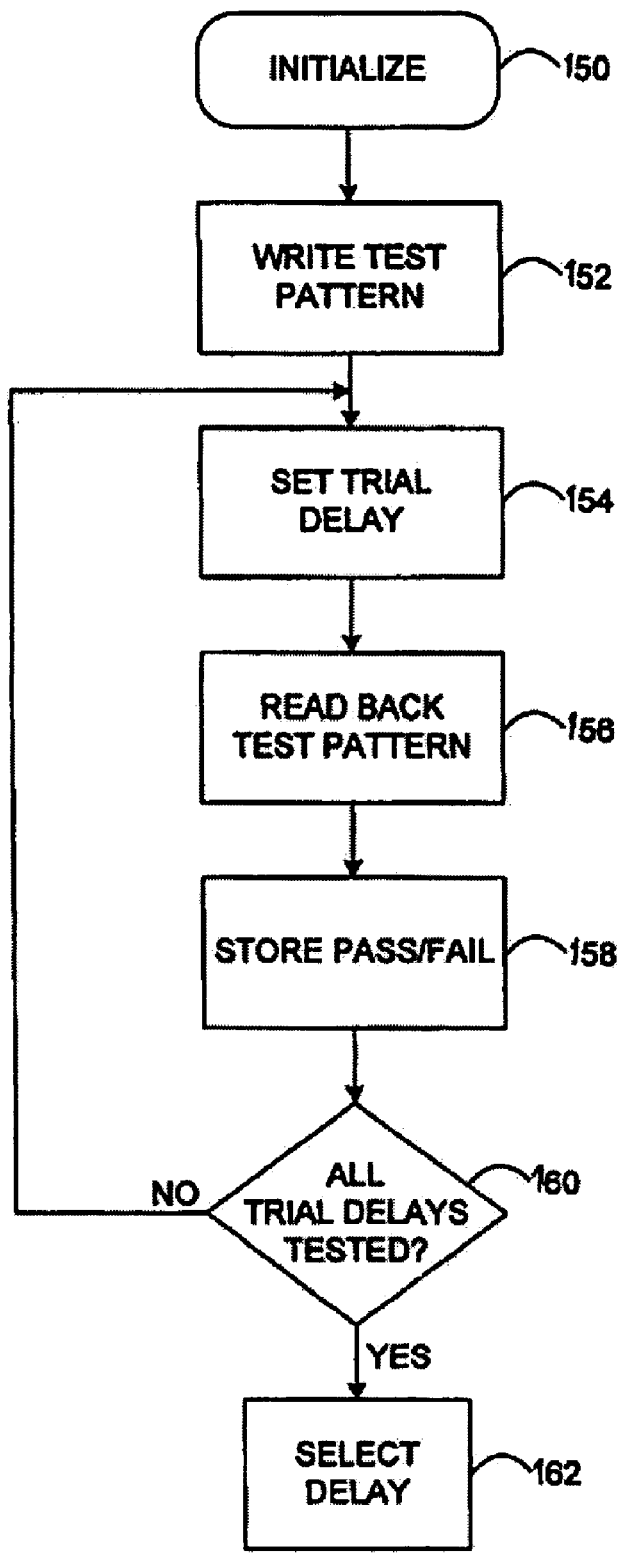
FIG. 6 is a flow chart illustrating a method of operation of the memory controller of FIG. 5.

FIG. 6 is a flow chart illustrating a method of operation of the memory controller 112 shown in FIG. 5.

In step 150, the device 4 is initialized and, in accordance with the invention, steps are taken to resynchronize the data captured by the capture register blocks 122 with the system clock, as it is used to clock the further registers 126a, 126b.

Although, in this illustrated embodiment, the method is described as taking place on initialisation of the device 4, the steps may be taken at intervals during the operation of the device, in order to ensure that the adaption of the resynchronization takes account of any subsequent changes in the operating voltage and/or temperature of the device.

During the adaption process, it is not possible to write data to, or read data from the external memory device 6, and a control signal is sent on the output line 140 to prevent access requests being made.

In step 152, a test data pattern is written to the external memory device 6, that is, a test data sequence is output from the dynamic phase alignment control block 130 to the multiplexer 136, which is then controlled such that this test data sequence is sent to the write controller 138, and written to the external memory device 6.

As will be understood by the person skilled in the art, the test data pattern can be chosen in order to maximize the probability that changes in the phase of the resynchronization clock will lead to changes in the data pattern read back. For example, the test data pattern may contain a sequence in which the data value toggles between the two binary values and/or in which a relatively long sequence of one binary value is followed by the other binary value.

As mentioned previously, the capture register blocks 122 operate on the basis of a DQS signal, which is sent from the external memory device 6, and is derived from the system clock frequency, but is delayed by an unknown time delay. Although the time delay is not known, it is possible to set upper and lower limits, defining a range within which the time delay must lie. The method according to the present invention is then concerned with determining the time delay which allows the captured data to be resynchronized with the system clock most accurately.

The delay is applied in the delay elements 174a, 176a, 174b, 176b, and the resynchronization registers 181a, 180a, 181b, 180b, which, as described above, are clocked by the resynchronization clock signal. The time delays applied by the delay elements 174a, 174b, and by the delay elements 176a, 176b, are tested in turn, in order to determine the value which allows the test sequence of data to be read back with the lowest probability of an error.

Thus, in step 154, a trial value is set for the delay. Specifically, the multiplexers 182a, 182b are controlled by a control signal from the dynamic phase alignment control block 130, to output the signal from a specific respective one of the resynchronization registers 181a, 180a, or 181b, 180b as the case may be, to which a specific one of the delay values had been applied in the associated delay element 174a, 176a, or 174b, 176b.

Then, in step 156, the test sequence of data is read back from the external memory device 6, and is supplied from the further registers 126a, 126b to the dynamic phase alignment control block 130. The control block 130 can then compare the data read back with the data which was written to the external memory device, and to determine whether it contains any errors. Then, in step 158, the control block 130 determines whether this trial value of the delay led to a 'pass', in which the data read back contains no errors, or to a 'fail', in which the data read back contains one or more errors.

In step 160, the control block 130 determines whether all of the required trial values of the delay have been tested in this way. If so, the process passes to step 162 but, if there remain any trial values of the delay to be tested, the process returns to steps 154, and the further trial value of the delay is tested.

When the process eventually reaches step 162, the control block 130 determines which of the trial values should be used for the further operation of the device.

Provided that the trial values have been selected appropriately, it is likely that some of the trial values in a central part of the range will have led to a 'pass' condition, while other trial values, towards the two ends of the range, will have lead to a 'fail' condition.

In a preferred embodiment of the invention, the trial value of the delay which is then selected in step 162 is the trial value which is in the middle of the group of values leading to 'pass' conditions. Where there are an even number of trial values leading to 'pass' conditions, one of the two values in the middle of this group is selected.

When the delay value has been selected, and the resynchronization is complete, a control signal may be output on the line 140, to indicate that data may now be written or read.

There is therefore described a memory controller, and a method of operation thereof, which allows accurate resynchronization of captured data with a system clock.

What is claimed is:

1. In a memory controller, adapted to write data to an external memory device, and adapted to capture data read from the external memory device, a method of adapting a resynchronization of the captured data with a system clock, comprising:
   (a) writing a first data from the memory controller to the external memory device in a test pattern;
   (b) reading the first data in the test pattern from the external memory device into the memory controller and capturing the read data in the test pattern into a register block of the memory controller, wherein the read data is captured using a strobe signal received with the read data;
   (c) setting a trial value for a relative phase of the captured data and a resynchronization clock of the memory controller;
   (d) resynchronizing the captured data using the set trial value for the relative phase of the captured data and the resynchronization clock;
   (e) determining whether the resynchronized captured data meets a predetermined pass criterion;
   (f) repeating steps (b), (c), (d) and (e) until a plurality of relative phases of captured data and the resynchronization clock have been tested; and
   (g) selecting one of said relative phases of the captured data and the resynchronization clock for subsequent data reads.

2. A method as claimed in claim 1, wherein said step of setting a trial value for the relative phase of captured data and the resynchronization clock comprises setting a trial value for a delay applied to the captured data.

3. A method as claimed in claim 1, wherein said step of setting a trial value for the relative phase of captured data and the resynchronization clock comprises setting a trial value for a delay applied to the resynchronization clock.

4. A memory controller adapted to write data to an external memory device and adapted to capture data read from the external memory device using a strobe signal read with the data, the memory controller comprising:
- a phase alignment control block that writes a test sequence of data to the external memory device;
- a capture block that, subsequent to readings of the test sequence of data from the external memory device, captures the test sequence of data read from the external memory device a plurality of times; and
- a resynchronization block that resynchronizes the captured data each time the test sequence of data is read from the external memory device, wherein respective different relative phases of the captured data and a resynchronization clock are used for each resynchronization,
- wherein the phase alignment control block selects one of said relative phases of the captured data and the resynchronization clock for subsequent data reads.

5. A memory controller as claimed in claim 4, comprising: a strobe control block, for controlling a phase of the received strobe signal to obtain said captured data.

6. A memory controller as claimed in claim 4, wherein the phase alignment control block controls an application of respective different delays to the captured data during said plurality of times when the test sequence of data is resynchronized.

7. A memory controller as claimed in claim 6, comprising:
- delay circuitry, for applying a plurality of different delays to the captured data, wherein the memory controller selects respectively differently delayed captured data during said plurality of times when the test sequence of data is read from the external memory device.

8. A memory controller as claimed in claim 4, wherein the phase alignment control block controls an application of respective different delays to the resynchronization clock during said plurality of times when the test sequence of data is resynchronized.

9. A memory controller as claimed in claim 8, comprising:
- delay circuitry, for receiving a clock signal and applying a plurality of different delays to the received clock signal, wherein the memory controller selects respective differently delayed clock signals as the resynchronization clock during said plurality of times when the test sequence of data is read from the external memory device.

10. A memory controller as claimed in claim 8, comprising:
- clock selection circuitry, for receiving a plurality of clock signals having respective different phases, wherein the memory controller selects respective different received clock signals as the resynchronization clock during said plurality of times when the test sequence of data is read from the external memory device.

11. In a memory controller, adapted to write data to an external memory device, and adapted to capture data read from the external memory device, a method of adapting a resynchronization of the captured data with a system clock, comprising:
- writing a test sequence of data to the external memory device;
- reading the test sequence of data from the external memory device a plurality of times;
- capturing the data read from the external memory device using a strobe signal read with the data;
- resynchronizing the captured data with respective different relative phases of the captured data and a resynchronization clock; and
- selecting one of said relative phases of the captured data and the resynchronization clock for subsequent data reads.

12. A method as claimed in claim 11, further comprising: controlling the phase of the received strobe signal which is used to obtain said captured data.

13. A method as claimed in claim 11, comprising:
- during said plurality of times when the test sequence of data is read from the external memory device, applying respective different delays to the captured data.

14. A method as claimed in claim 13, comprising:
- applying a plurality of different delays to the captured data; and
- during said plurality of times when the test sequence of data is read from the external memory device, selecting respectively differently delayed captured data.

15. A method as claimed in claim 11, comprising:
- during said plurality of times when the test sequence of data is read from the external memory device, applying respective different delays to the resynchronization clock.

16. A method as claimed in claim 15, comprising:
- receiving a clock signal;
- applying a plurality of different delays to the received clock signal; and
- during said plurality of times when the test sequence of data is read from the external memory device, selecting respective differently delayed clock signals as the resynchronization clock.

17. A method as claimed in claim 15, comprising:
- receiving a plurality of clock signals having respective different phases; and
- during said plurality of times when the test sequence of data is read from the external memory device, selecting respective different received clock signals as the resynchronization clock.

18. A method as claimed in claim 11, comprising performing said adapting of said resynchronization on initialisation of the memory controller.

19. A method as claimed in claim 18, further comprising performing said adapting of said resynchronization periodically during operation of the memory controller.

20. A memory controller, adapted to write data to an external memory device, and adapted to capture data read from the external memory device, the memory controller comprising:
- means for writing a test sequence of data to the external memory device;
- means for reading the test sequence of data from the external memory device a plurality of times;
- means for capturing the data read from the external memory device using a strobe signal read with the data;
- means for resynchronizing the captured data with respective different relative phases of the captured data and a resynchronization clock; and
- means for selecting one of said relative phases of the captured data and the resynchronization clock for subsequent data reads.

21. A memory controller as claimed in claim 20, further comprising: means for controlling the phase of the received strobe signal which is used to obtain said captured data.

22. A memory controller as claimed in claim 20, comprising:
- means for applying respective different delays to the captured data during said plurality of times when the test sequence of data is read from the external memory device.

23. A memory controller as claimed in claim 22, comprising:
   means for applying a plurality of different delays to the captured data; and
   means for selecting respectively differently delayed captured data during said plurality of times when the test sequence of data is read from the external memory device.

24. A memory controller as claimed in claim 20, comprising:
   means for applying respective different delays to the resynchronization clock during said plurality of times when the test sequence of data is read from the external memory device.

25. A memory controller as claimed in claim 24, comprising:
   means for receiving a clock signal;
   means for applying a plurality of different delays to the received clock signal; and
   means for selecting respective differently delayed clock signals as the resynchronization clock during said plurality of times when the test sequence of data is read from the external memory device.

26. A memory controller as claimed in claim 24, comprising:
   means for receiving a plurality of clock signals having respective different phases; and
   means for selecting respective different received clock signals as the resynchronization clock during said plurality of times when the test sequence of data is read from the external memory device.

27. A memory controller as claimed in claim 24, comprising means for performing said adapting of said resynchronization on initialisation of the memory controller.

28. A memory controller as claimed in claim 27, further comprising means for performing said adapting of said resynchronization periodically during operation of the memory controller.

\* \* \* \* \*